(12) United States Patent
Zare-Hoseini et al.

(10) Patent No.: US 8,537,042 B2
(45) Date of Patent: Sep. 17, 2013

(54) MULTI-BIT DIGITAL TO ANALOGUE CONVERTER AND A DELTA-SIGMA ANALOGUE TO DIGITAL CONVERTER

(75) Inventors: Hashem Zare-Hoseini, Cambridge (GB); Peter Williams, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/359,741

(22) Filed: Jan. 27, 2012

(65) Prior Publication Data

US 2012/0194366 A1    Aug. 2, 2012

(30) Foreign Application Priority Data

Jan. 31, 2011   (GB) .................................. 1101549.2

(51) Int. Cl.
*H03M 1/66*   (2006.01)
*H03M 3/02*   (2006.01)

(52) U.S. Cl.
USPC .......................................... 341/144; 341/143

(58) Field of Classification Search
USPC .................................................. 341/143, 144
See application file for complete search history.

(56) References Cited

U.S. PATENT DOCUMENTS

| | | | |
|---|---|---|---|
| 2006/0255992 A1* | 11/2006 | Sakiyama et al. | 341/143 |
| 2009/0040087 A1* | 2/2009 | Liu et al. | 341/144 |
| 2009/0085783 A1* | 4/2009 | Kim | 341/144 |
| 2009/0296858 A1 | 12/2009 | Nozawa et al. | |
| 2011/0074613 A1* | 3/2011 | Newman | 341/143 |

FOREIGN PATENT DOCUMENTS

EP    1359671    11/2003

OTHER PUBLICATIONS

Search Report mailed Feb. 21, 2013 in corresponding application EP 12152538.

* cited by examiner

*Primary Examiner* — Howard Williams
(74) *Attorney, Agent, or Firm* — Pillsbury Winthrop Shaw Pittman LLP (57) ABSTRACT

The present invention relates to a multi-bit digital to analogue converter (DAC) and to a delta-sigma analogue to digital converter employing such a DAC. The DAC has a multi-bit input, a plurality of elements for processing an input signal received at the input and a selector for selecting, based on the input signal, one or more of the DAC elements to process the signal. The DAC has control means for controlling the selector such that if the input to the DAC is below a predetermined level for a predetermined period of time the selector is operative to select only a single one of the DAC elements to process the input signal. Also disclosed is a delta-sigma analogue to digital converter (ADC) employing such a DAC.

24 Claims, 6 Drawing Sheets

MULTI-BIT DIGITAL TO ANALOGUE CONVERTER AND A DELTA-SIGMA ANALOGUE TO DIGITAL CONVERTER

TECHNICAL FIELD

The present invention relates to a multi-bit digital to analogue converter and to a delta-sigma analogue to digital converter employing such a multi-bit digital to analogue converter.

BACKGROUND TO THE INVENTION

Delta-sigma analogue to digital converters (ADCs) are well known and are commonly used in high-resolution applications because, compared to other ADC implementations, the need for complex anti-aliasing filters is reduced, differential non-linearity errors are reduced and they are more robust. By trading accuracy for speed, delta-sigma ADCs allow high performance to be achieved with high tolerance to analogue component imperfections. Delta-sigma ADCs are often seen as the best choice for low to moderate frequency, high resolution applications.

Delta-sigma ADCs can be implemented using single-bit or multi-bit feedback systems. Single-bit feedback systems are commonly used when moderate resolution is required and the master clock of the system in which the ADC is used is low-jitter. Delta-sigma ADCs with multi-bit feedback systems offer higher signal to noise ratio (SNR), lower sensitivity to jitter and in many cases lower power consumption than those with single-bit feedback systems. However, such systems require multi-bit feedback digital to analogue converters (DACs) which include multiple DAC elements. For example, a 3 bit DAC may include seven such elements in the form of current or voltage sources (one for each of the seven possible non-zero binary input values) which can be selected to generate the output voltage or current representing the binary input value.

Such a feedback DAC may suffer from "mismatch" between its elements, meaning that the values of the components making up the elements are not identical as a result of manufacturing tolerances and the like. This mismatch between the elements introduces harmonic distortion in the output of the ADC and raises the noise floor of the ADC, thereby reducing its dynamic range and SNR and increasing its total harmonic distortion (THD).

Techniques have been developed to address this problem, and one group of such techniques are known collectively as dynamic element matching (DEM). In one example of a stochastic DEM technique, elements of the feedback DAC are selected at random each clock cycle to process the DAC input. An example of a deterministic DEM technique is data weighted averaging (DWA). In this technique an algorithm is used to select different elements of the feedback DAC each clock cycle to process the DAC input. For example, in a 3 bit DAC, the input may have a binary value 011 in a first clock cycle, requiring three of the elements of the DAC to be activated to generate the required output current or voltage. In a second clock cycle the input may have changed to 001, for example, requiring only one of the elements of the DAC to be activated to generate the required output current or voltage. In this example the elements activated for the first clock cycle would be deactivated for the second clock cycle and a different element would be activated for the second clock cycle to generate the required output voltage or current, thus avoiding immediate reuse of the elements activated for the first clock cycle. In this way the effects of the mismatch are not concentrated in a single part of the frequency spectrum of the ADC, but are spread over a wider frequency range, thereby improving the SNR of the ADC and reducing its THD.

In some applications, such as high-quality audio, the input signal to the delta-sigma ADC has a very low amplitude for much of the time, such that only one of the feedback DAC elements is required to process the input. In principle no element mismatching should be experienced for such a signal, and thus there should be low harmonic distortion. However, where a DEM algorithm is used, the DEM algorithm selects a different element of the feedback DAC each clock cycle, thereby introducing additional noise, including switching noise, into the ADC, which in turn leads to a reduction in the ADC's SNR.

SUMMARY OF INVENTION

According to a first aspect of the present invention there is provided a multi-bit delta-sigma analogue to digital (ADC) converter comprising: a multi-bit feedback digital to analogue converter (DAC) having a multi-bit input and a plurality of elements for processing a signal input to the feedback DAC; a selector for selecting, based on the signal input to the feedback DAC, one or more of the plurality of DAC elements to process the input signal; and control means for controlling the selector such that if the signal input to the feedback DAC is below a predetermined level for a predetermined period of time the selector is operative to select only a single one of the DAC elements to process the input signal.

When the input signal level is below the predetermined level its value is such that only one of the feedback DAC elements is required to convert the input digital signal into an analogue output signal. When this situation has persisted for the predetermined time period only a single one of the feedback DAC elements is selected to process the input signal, and thus mismatch does not occur, as the same element is being used to process the incoming signal for as long as it remains below the threshold level. Thus, harmonic distortion and noise are reduced and the SNR of the ADC increases.

The selector may be configured to receive the input signal and output a control signal to a first latch which is configured to activate the selected elements of the feedback DAC to process the input signal.

The multi-bit delta-sigma ADC may further comprise a second latch having an input connected to an output of the selector and an output connected to an input of the selector, wherein the selector is configured to generate a pointer to an element of the feedback DAC to be used in processing a subsequent input signal and to output the pointer so generated to the second latch such that when the feedback DAC receives the subsequent input signal the pointer is output by the second latch to the selector for use by the selector to generate the control signal to the first latch.

The control means may comprise a threshold unit which receives the input signal, the threshold unit being configured to compare the value of the input signal to a predetermined threshold and to output a flag if the value of the input signal is below the threshold for the predetermined period of time.

Operation of the second latch may be controlled by the flag output by the threshold unit, such that if a flag is output by the threshold unit the pointer is not output by the second latch.

The second latch may have a clock signal input and may be configured to output the pointer on receipt of a clock signal at the clock signal input, wherein if a flag is output by the threshold unit the clock signal is not received by the second latch.

The multi-bit delta-sigma ADC may further comprise a logic OR gate which receives at its inputs the output of the threshold unit and the clock signal and whose output is connected to the clock signal input of the second latch, such that if a flag is output by the threshold unit the clock signal input of the second latch has a constant value.

The threshold unit may comprise a logic network having an input for receiving the signal input to the DAC and an output connected to an input of an input latch of the threshold unit, the threshold unit further comprising an output latch having a reset input connected to the output of the input latch and a data input connected to a constant logic level such that the output of the output latch is at the constant logic level until a reset signal is received from the output of the input latch, wherein the output of the output latch is the output of the threshold unit.

The threshold unit may further comprise one or more delay latches connected between the input latch and the output latch for delaying the output of the threshold unit.

The predetermined period of time may be determined by the delay latch(es) of the threshold unit.

The predetermined level may be of the order of one quantisation step of a quantiser of the ADC The selector may comprise a digital encoder.

According to a second aspect of the invention there is provided a multi-bit digital to analogue converter (DAC) having a multi-bit input and a plurality of elements for processing a signal input to the DAC, the multi-bit DAC comprising: a selector for selecting, based on the signal input to the DAC, one or more of the plurality of DAC elements to process the input signal; and control means for controlling the selector such that if the signal input to the DAC is below a predetermined level for a predetermined period of time the selector is operative to select only a single one of the DAC elements to process the input signal.

The selector may be configured to receive the input signal and output a control signal to a first latch which is configured to activate the selected elements of the DAC to process the input signal.

The DAC may further comprise a second latch having an input connected to an output of the selector and an output connected to an input of the selector, wherein the selector is configured to generate a pointer to an element of the feedback DAC to be used in processing a subsequent input signal and to output the pointer so generated to the second latch such that when the feedback DAC receives the subsequent input signal the pointer is output by the second latch to the selector for use by the selector to generate the control signal to the first latch.

The control means may comprise a threshold unit which receives the input signal, the threshold unit being configured to compare the value of the input signal to a predetermined threshold and to output a flag if the value of the input signal is below the threshold for the predetermined period of time.

Operation of the second latch may be controlled by the flag output by the threshold unit, such that if a flag is output by the threshold unit the pointer is not output by the second latch.

The second latch may have a clock signal input and may be configured to output the pointer on receipt of a clock signal at the clock signal input, wherein if a flag is output by the threshold unit the clock signal is not received by the second latch.

The DAC may further comprise a logic OR gate which receives at its inputs the output of the threshold unit and the clock signal and whose output is connected to the clock signal input of the second latch, such that if a flag is output by the threshold unit the clock signal input of the second latch has a constant value.

The threshold unit may comprise a logic network having an input for receiving the signal input to the DAC and an output connected to an input of an input latch of the threshold unit, the threshold unit further comprising an output latch having a reset input connected to the output of the input latch and a data input connected to a constant logic level such that the output of the output latch is at the constant logic level until a reset signal is received from the output of the input latch, wherein the output of the output latch is the output of the threshold unit.

The threshold unit may further comprise one or more delay latches connected between the input latch and the output latch for delaying the output of the threshold unit.

The predetermined period of time may be determined by the delay latch(es) of the threshold unit.

The predetermined level may be of the order of one quantisation step of the DAC

The selector may comprise a digital encoder.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
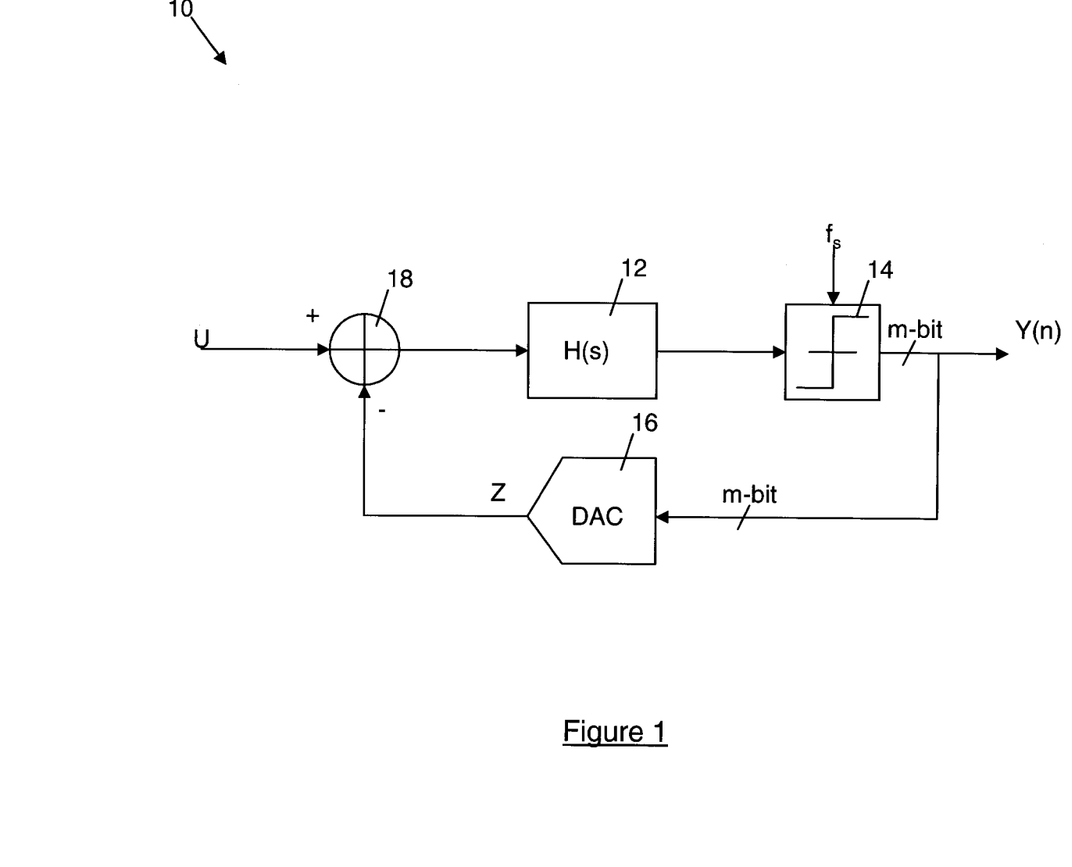
FIG. 1 is a schematic representation of a typical delta-sigma analogue to digital converter (ADC)

Referring first to FIG. 1, a delta-sigma analogue to digital converter (ADC) is shown generally at 10. It will be appreciated that the schematic illustration of FIG. 1 shows functional blocks representing functional elements of a delta-sigma ADC, but are not necessarily representative of the physical construction of an ADC.

The ADC 10 comprises a processing block 12 which receives an analogue input signal U. The input signal U is processed by the processing block 12 which, as is conventional in a delta-sigma ADC, includes one or more integrators which are configured to produce an analogue voltage or current output. This analogue output voltage or current is passed to a quantiser 14 which converts the analogue voltage or current produced by the processing block 12 into a multi-bit digital signal Y(n) representing the analogue signal U input to the ADC 10. The multi-bit digital signal Y(n) is output by the ADC 10 and is also passed to a multi-bit input of a feedback digital to analogue converter (DAC) 16 which generates an analogue output Z representative of the multi-bit digital input signal, which is subtracted from the input signal U by a subtractor 18. The negative feedback loop formed by the feedback DAC 16 and the subtractor 18 is operative to maintain the digital output of the quantiser 14, and thus the output of the ADC 10, as close as possible to the analogue input.

Figure 2:
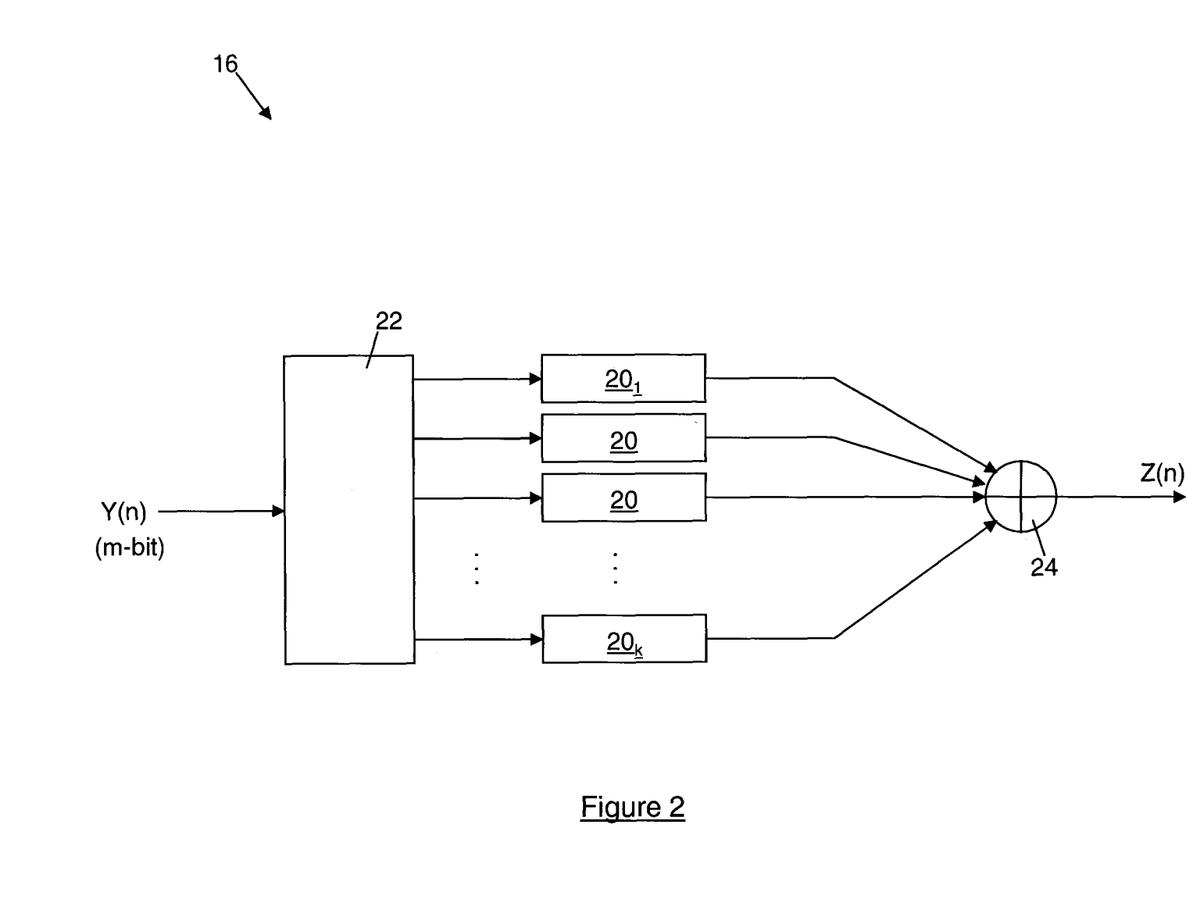
FIG. 2 is a schematic representation of a multi-bit feedback digital to analogue converter used in the delta-sigma ADC of FIG. 1.

FIG. 2 is a schematic representation of the feedback DAC 16, which comprises a plurality of DAC elements 20, such as voltage or current sources. The number of elements 20 depends upon the number of input bits to the DAC 16 and is equal to the number of possible non-zero values (or quantisation levels) represented by the input signals. Thus, a 3 bit DAC 16 has seven elements 20, as there are seven non-zero quantisation levels in a 3-bit digital signal. In general, the number of elements 20 in the DAC is equal to $2^m-1$, where m is the number of input bits to the DAC.

The inputs of the elements 20 are connected to outputs of a digital encoder 22 which receives an m-bit input signal Y(n), whilst the outputs of the elements 20 are connected to an adder 24, such that a signal Z output by the DAC 16 is the sum of the outputs of the elements 20. On receiving the m-bit input signal Y(n) the digital encoder 22 selects and activates the number of elements 20 required to generate an analogue output signal Z (voltage or current) representative of the digital input signal. For example, if the input multi-bit digital signal Y(n) is 011 (i.e. has a value of 3) then three of the elements 20 are selected and activated by the digital encoder 22.

Figure 3:
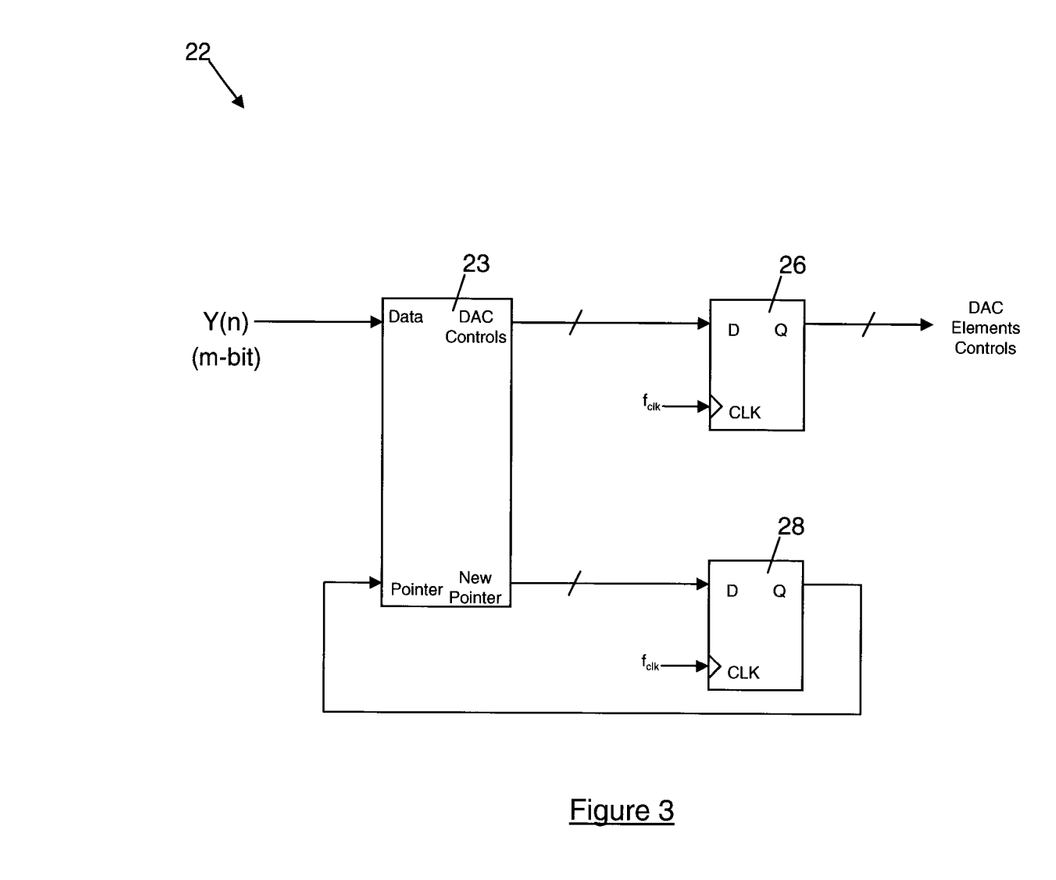
FIG. 3 is a schematic diagram illustrating a digital encoder used to implement a data weighted averaging (DWA) technique.

FIG. 3 is a schematic representation of a digital encoder 22 which may be used to implement a data weighted averaging (DWA) technique which may be used in the DAC 16. In the architecture illustrated in FIG. 3 a DAC element controller 23 of the digital encoder 22 receives the m-bit digital input signal and outputs a k-bit control signal to a first latch 26 having k outputs which control the selection and activation of the k elements 20 of the DAC 16. The first latch 26 receives a clock signal $f_{clk}$ from a master clock of the delta-sigma ADC 20 for synchronisation purposes.

The DAC element controller 23 is also connected to a second latch 28 which controls a pointer which is used to determine which of the k elements 20 of the DAC will be selected to process the multi-bit input signal Y(n) in the next clock cycle. The digital encoder 22 therefore effectively constitutes a selector for selecting which of the k elements of the DAC 20 will be used to process the multi-bit digital input signal Y(n) in the next clock cycle.

In the exemplary case of a three bit DAC 16 there are seven elements 20, which may be regarded as being numbered 1 to 7. On receiving a first multi-bit digital input signal Y(n) the first element $20_1$ (i.e. the element 20 numbered 1) is selected as the first of the elements 20 that will be used to process the input signal Y(n). The number of additional elements used to process the input signal Y(n) depends on the value of the input signal. For example, if the input signal is 011, three elements 20 will be required to process the input signal. Thus, in addition to the first element $20_1$, the second and third elements $20_2$ and $20_3$ are used to process the input signal. In other words, processing of the input signal Y(n) starts at element $20_1$ and continues in elements $20_2$ and $20_3$ of the DAC 16.

To avoid immediately re-using the selected elements 20 in processing the input signal Y(n+1) received in the next clock cycle the digital encoder 22 generates a numerical value or pointer P(n+1) based on the value of the current input signal Y(n), by increasing the pointer value by the number of elements 20 selected to process the current input signal Y(n). The pointer value P(n+1) is output to a second latch 28, which has an output which is connected to a pointer input of the DAC element controller 23. The second latch 28 also receives a clock signal from the master clock of the delta-sigma ADC 10 such that on the next clock pulse the calculated pointer value P(n+1) is loaded into the second latch 28 and is received at the pointer input of the digital encoder and becomes the pointer value used by the DAC element controller 23 to determine where processing of the next input signal Y(n+1) will start in the elements 20 of the DAC 16.

Initially the pointer value P is set to 1, to indicate that the element $20_1$ is the first element to be used to process the first input signal received by the digital encoder 22. Thus, in the example above the pointer value is increased by 3 such that the new pointer value P(n+1), indicating where processing of the next input signal Y(n+1) is to start, is 4. Thus, processing of the next input signal Y(n+1) will start at element $20_4$. The new pointer value P(n+1) is calculated by a modulo N operation to ensure that the new pointer value P(n+1) cannot exceed the number k of elements 20 of the DAC 16.

Figure 4:
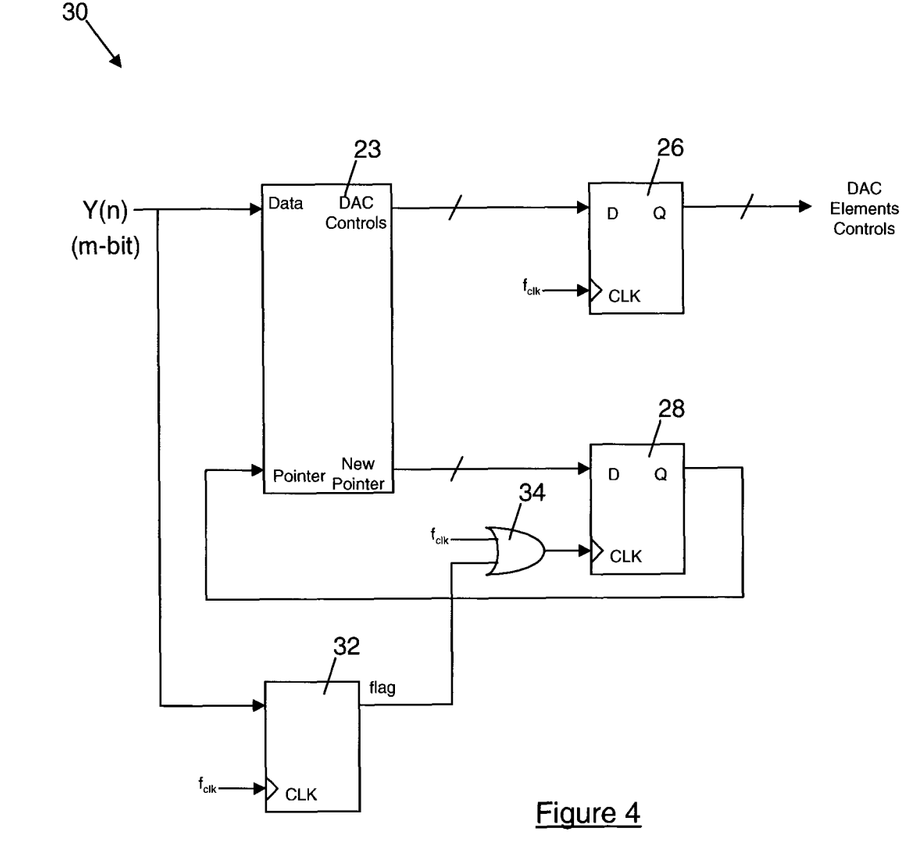
FIG. 4 is a schematic diagram illustrating part of an embodiment of a multi-bit digital to analogue converter (DAC) according to one aspect of the present invention which is suitable for use in a multi-bit delta-sigma analogue to digital converter (ADC) according to another aspect of the present invention.

FIG. 4 is a schematic representation of a DAC forming part of a delta-sigma ADC in which the DAC element controller 23, and therefore the digital encoder 22, can be controlled to prevent the value of the pointer P from changing from one clock cycle to the next, thus ensuring that the same element 20 of the DAC 26 will be used to process consecutive input signals.

In the DAC shown generally at 30 in FIG. 4 a threshold unit 32 is provided and has an input which receives the multi-bit digital input signal Y(n). The threshold unit 32 also receives a clock signal $f_{clk}$ from a master clock of the DAC 30. The threshold unit 32 is configured to compare the value of the input signal Y(n) to a predetermined threshold, and to count the number of clock cycles for which the value of the input signal Y(n) is below the predetermined threshold. If the value of the input signal Y(n) is below the predetermined threshold for a predetermined number of clock cycles a flag signal is output by the threshold unit 32.

The output of the threshold unit 32 is connected to a first input of a two-input OR gate 34, whose second input is connected to the master clock of the DAC 30. The output of the OR gate 34 is connected to the clock input of the second latch 28. Thus, when the flag signal is high, indicating that the value of the input signal has been below the predetermined level for the predetermined number of clock cycles, the output of the OR gate 34 is high, meaning that the clock signal of the second latch does not change, and thus the value of the pointer P at the digital encoder also does not change. Thus, the same single element 20 of the DAC 16 is used as the starting point for processing all of the input signals Y(n) received by the digital encoder 22 while the flag signal is high.

By effectively disabling the DWA scheme implemented by the selector formed by the digital encoder 22 when the input is below the predetermined level for the predetermined time, the benefits of reduced harmonic distortion and noise associated with the use of a single element 20 of the feedback DAC 26 can be achieved when the input signal level is low, whilst the advantages of the DWA scheme can be achieved at higher input signal levels.

The predetermined threshold is selected to correspond to a small input signal for which processing does not require all of the elements 20. For example, in audio applications where the input signal is low (quiet) for long periods of time only one of the elements 20 may be required to process the input signal during the periods in which the input signal level is low. In this application the threshold may be of the order of one quantisation step of the quantiser 14 of the ADC 30, but it will be appreciated that different thresholds may be used for other applications. For example, in a three-bit DAC 16 having a range of +1 volt to −1 volt the quantisation step is around 2 volts/7 quantisation levels=0.286 volts. Thus the threshold may be set at 0.286 volts or ±0.143 volts.

The predetermined number of cycles is selected to ensure that the flag signal is only set high in periods where the input signal is likely to be low for an extended period of time, to avoid unnecessary switching of the elements 20 of the DAC 16, which can inject additional noise into the ADC 30. However, the predetermined number of cycles must be small enough that the flag is set high for long enough to achieve a meaningful advantage of using only one of the elements 20 of the DAC 16.

Figure 5:
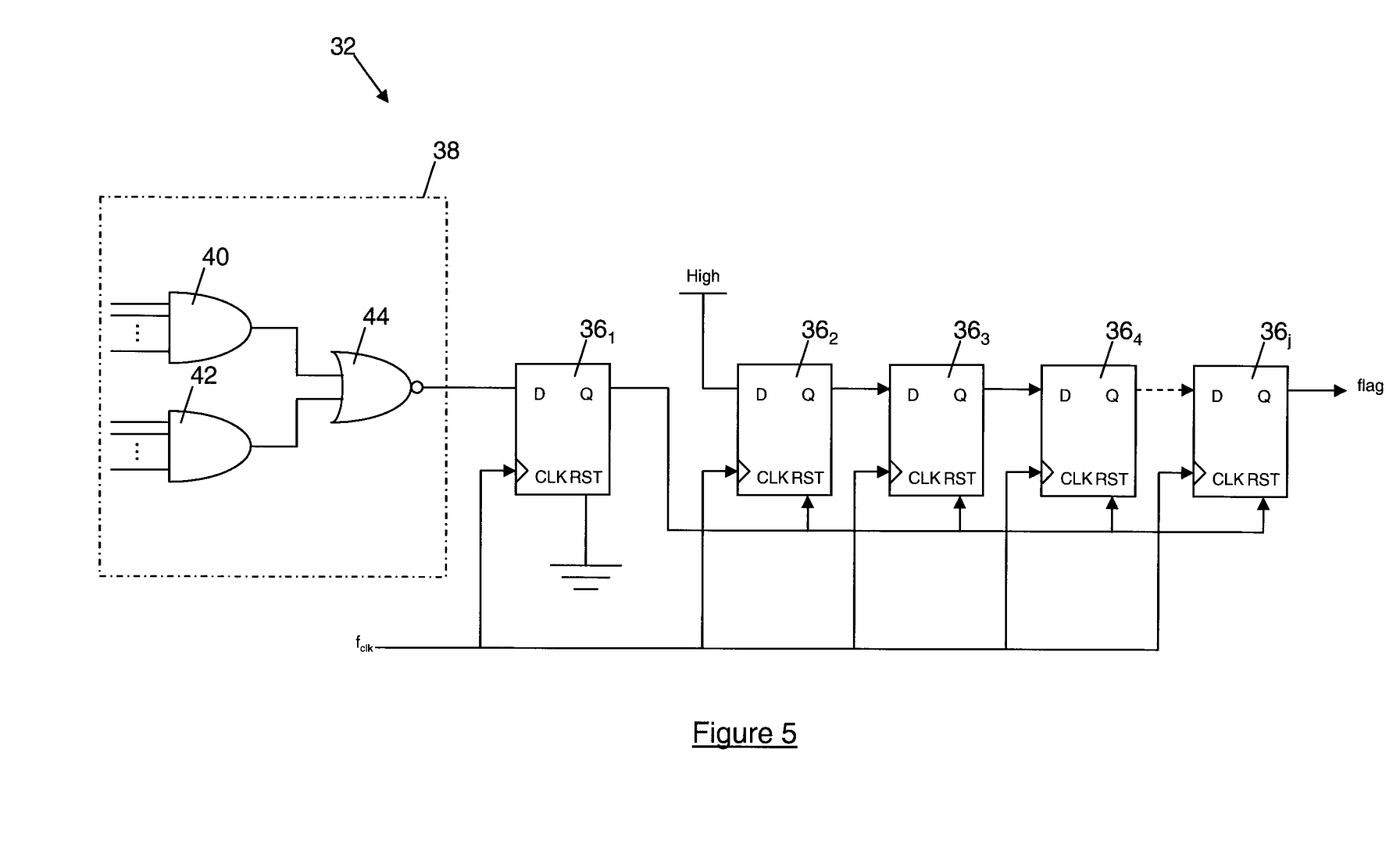
FIG. 5 is a schematic diagram illustrating an exemplary implementation of a level detector which is suitable for use in the multi-bit DAC of FIG. 4.

FIG. 5 is a schematic illustration of an embodiment of the threshold unit 32, which in this example comprises a plurality of latches 36. Each of the latches 36 receives the clock signal $f_{clk}$ (from the master clock of the delta-sigma ADC 30. The first latch (which may be regarded as an input latch) $36_1$ has an output which is connected to a reset input of each of the other latches 36, whilst the output of the last latch $36_k$ outputs the flag signal input to the OR gate 34, and thus may be regarded as an output latch.

An input of the first latch $36_1$ is connected to the output of a logic network 38, which in the example shown in FIG. 5 comprises first and second multi-input AND gates 40, 42 whose outputs are input to a two-input NOR gate 44. The input of a second latch $36_2$ is connected to a logic high signal, such that its output is high as a default. The output of the second latch $36_2$ is connected to the input of a third latch $36_3$, and the subsequent latches $36_4 \ldots 36_j$ are daisy chained with the output of a latch $36_n$ being connected to the input of the next latch $36_{n+1}$.

The first AND gate 40 of the logic network 38 is configured to output a logic high signal when a first combination of bits corresponding to a first value is received at its inputs, whilst the second AND gate 42 is configured to output a high logic signal when a second combination of bits corresponding to a second value is received at its inputs. Thus, a range of input signal values for which the flag should be set high can be defined by appropriately configuring the AND gates 40, 42. For example, the first AND gate 40 may be configured to output a logic high signal when the input signal represents the value +0.143 volts, which may be represented, for example, by the bit sequence 000, whilst the second AND gate may be configured to output a logic high signal when the input signal represents the value −0.143 volts, which may be represented, for example, by the bit sequence 100.

The output of the NOR gate 44 is high only when both of its inputs are low, i.e. when the value of the input signal is outside the range defined by the AND gates 40, 42, which in the example given above is when the input signal is greater than +0.143 volts or less than −0.143 volts. In this case, the output of the first latch $36_1$ is high, causing the remaining latches 36 to reset to a logic low output, so that the flag is set low. On the other hand, when the output of the NOR gate 44 is low, the output of the first latch $36_1$ is low so the remaining latches do not reset, and the logic 1 input of the second latch $36_2$ ripples through the latches 36 on each clock cycle, eventually setting the flag high, unless and until the output of the NOR gate 44 goes high, as a result of the input signal falling outside the range defined by the AND gates 40, 42.

From the above description it will be apparent that the number of latches 36 determines the predetermined number of clock cycles for which the input signal must be below the predetermined threshold before the flag is set high and a single element 20 of the DAC 16 is used to process the input signal. Thus, the latches 36 between the input (first) latch $36_1$ the output (last) latch $36_k$ may be regarded as delay latches.

Figure 6:
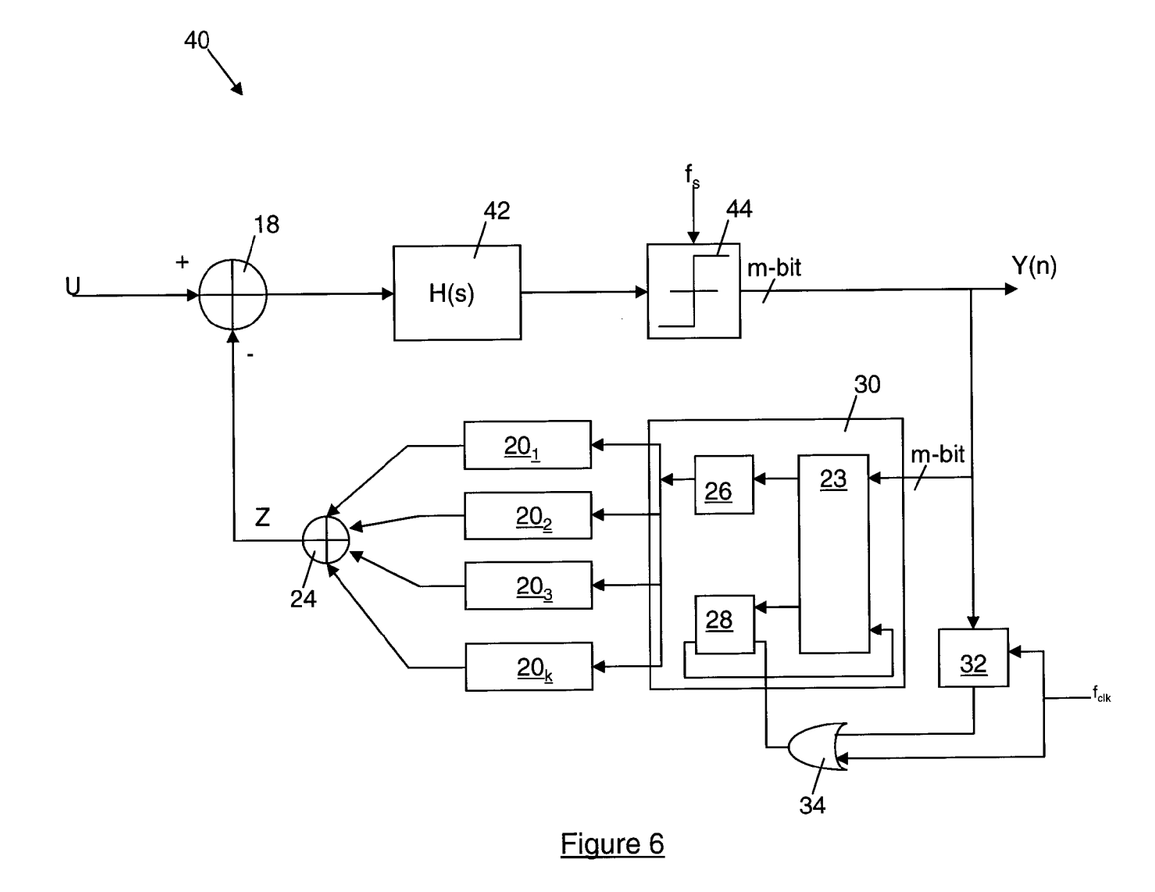
FIG. 6 is a schematic diagram illustrating a multi-bit delta-sigma ADC incorporating the DAC of FIG. 4 which includes the level detector of FIG. 4.

FIG. 6 is a schematic representation of a delta-sigma ADC incorporating the DAC 30 of FIG. 4, which includes the threshold unit 32 of FIG. 5. As can be seen from FIG. 6, the delta sigma ADC 40 has an input for receiving an analogue input signal U, which is passed to a processing unit 42 containing one or more integrators, as is conventional in a delta-sigma ADC. The output of the processing unit 42 is passed to a quantiser 44 which generates a multi-bit quantised output signal Y(n), which is the output of the ADC 40, and which is also passed to the DAC 30, the output Z of which is subtracted from the input U of the ADC 40 to maintain the digital output Y(n) of the ADC 40 as close as possible to its analogue input U.

Although the description above relates to a delta-sigma analogue to digital converter, it will be apparent that the DAC 30 described in this specification can also be used as a standalone device to implement the techniques described herein in applications where DEM is used.

It will be appreciated by those skilled in the relevant art that the functional elements of the ADC 10 described above with reference to FIGS. 1 to 6 are presented as examples only, and could be implemented in a variety of different ways. It will also be appreciated that the ADC 30 of the present invention could be implemented in a variety of ways, for example using discrete components or in an application specific integrated circuit (ASIC), a field programmable gate array (FPGA), as a dedicated integrated circuit (IC) or as part of an integrated circuit.

The invention claimed is:

1. A multi-bit delta-sigma analogue to digital (ADC) converter comprising:
    a multi-bit feedback digital to analogue converter (DAC) having a multi-bit input and a plurality of elements for processing a signal input to the feedback DAC;
    a selector for selecting, based on the signal input to the feedback DAC, one or more of the plurality of DAC elements to process the input signal; and
    control means for controlling the selector such that if the signal input to the feedback DAC is below a predetermined level for a predetermined period of time the selector is operative to select only a single one of the DAC elements to process the input signal.

2. A multi-bit delta-sigma ADC according to claim 1 wherein the selector is configured to receive the input signal and output a control signal to a first latch which is configured to activate the selected elements of the feedback DAC to process the input signal.

3. A multi-bit delta-sigma ADC according to claim 2 further comprising a second latch having an input connected to an output of the selector and an output connected to an input of the selector, wherein the selector is configured to generate a pointer to an element of the feedback DAC to be used in processing a subsequent input signal and to output the pointer so generated to the second latch such that when the feedback DAC receives the subsequent input signal the pointer is output by the second latch to the selector for use by the selector to generate the control signal to the first latch.

4. A multi-bit delta-sigma ADC according to claim 3 wherein the control means comprises a threshold unit which receives the input signal, the threshold unit being configured to compare the value of the input signal to a predetermined threshold and to output a flag if the value of the input signal is below the threshold for the predetermined period of time.

5. A multi-bit delta-sigma ADC according to claim 4 wherein operation of the second latch is controlled by the flag output by the threshold unit, such that if a flag is output by the threshold unit the pointer is not output by the second latch.

6. A multi-bit delta-sigma ADC according to claim 5 wherein the second latch has a clock signal input and is configured to output the pointer on receipt of a clock signal at the clock signal input, wherein if a flag is output by the threshold unit the clock signal is not received by the second latch.

7. A multi-bit delta-sigma ADC according to claim 6 further comprising a logic OR gate which receives at its inputs the output of the threshold unit and the clock signal and whose output is connected to the clock signal input of the second latch, such that if a flag is output by the threshold unit the clock signal input of the second latch has a constant value.

8. A multi-bit delta-sigma ADC according to claim 4 wherein the threshold unit comprises a logic network having an input for receiving the signal input to the DAC and an output connected to an input of an input latch of the threshold unit, the threshold unit further comprising an output latch having a reset input connected to the output of the input latch and a data input connected to a constant logic level such that the output of the output latch is at the constant logic level until a reset signal is received from the output of the input latch, wherein the output of the output latch is the output of the threshold unit.

9. A multi-bit delta-sigma ADC according to claim 8 wherein the threshold unit further comprises one or more delay latches connected between the input latch and the output latch for delaying the output of the threshold unit.

10. A multi-bit delta-sigma ADC according to claim 9 wherein the predetermined period of time is determined by the delay latch(es) of the threshold unit.

11. A multi-bit delta-sigma ADC according to claim 1 wherein the predetermined level is of the order of one quantisation step of a quantiser of the ADC.

12. A multi-bit delta-sigma ADC according to claim 1 wherein the selector comprises a digital encoder.

13. A multi-bit digital to analogue converter (DAC) having a multi-bit input and a plurality of elements for processing a signal input to the DAC, the multi-bit DAC comprising:
 a selector for selecting, based on the signal input to the DAC, one or more of the plurality of DAC elements to process the input signal; and
 control means for controlling the selector such that if the signal input to the DAC is below a predetermined level for a predetermined period of time the selector is operative to select only a single one of the DAC elements to process the input signal.

14. A multi-bit DAC according to claim 13 wherein the selector is configured to receive the input signal and output a control signal to a first latch which is configured to activate the selected elements of the DAC to process the input signal.

15. A multi-bit DAC according to claim 14 further comprising a second latch having an input connected to an output of the selector and an output connected to an input of the selector, wherein the selector is configured to generate a pointer to an element of the DAC to be used in processing a subsequent input signal and to output the pointer so generated to the second latch such that when the DAC receives the subsequent input signal the pointer is output by the second latch to the selector for use by the selector to generate the control signal to the first latch.

16. A multi-bit DAC according to claim 15 wherein the control means comprises a threshold unit which receives the input signal, the threshold unit being configured to compare the value of the input signal to a predetermined threshold and to output a flag if the value of the input signal is below the threshold for the predetermined period of time.

17. A multi-bit DAC according to claim 16 wherein operation of the second latch is controlled by the flag output by the threshold unit, such that if a flag is output by the threshold unit the pointer is not output by the second latch.

18. A multi-bit DAC according to claim 17 wherein the second latch has a clock signal input and is configured to output the pointer on receipt of a clock signal at the clock signal input, wherein if a flag is output by the threshold unit the clock signal is not received by the second latch.

19. A multi-bit DAC according to claim 18 further comprising a logic OR gate which receives at its inputs the output of the threshold unit and the clock signal and whose output is connected to the clock signal input of the second latch, such that if a flag is output by the threshold unit the clock signal input of the second latch has a constant value.

20. A multi-bit DAC according to claim 16 wherein the threshold unit comprises a logic network having an input for receiving the signal input to the DAC and an output connected to an input of an input latch of the threshold unit, the threshold unit further comprising an output latch having a reset input connected to the output of the input latch and a data input connected to a constant logic level such that the output of the output latch is at the constant logic level until a reset signal is received from the output of the input latch, wherein the output of the output latch is the output of the threshold unit.

21. A multi-bit DAC according to claim 20 wherein the threshold unit further comprises one or more delay latches connected between the input latch and the output latch for delaying the output of the threshold unit.

22. A multi-bit DAC according to claim 21 wherein the predetermined period of time is determined by the delay latch(es) of the threshold unit.

23. A multi-bit DAC according to claim 13 wherein the predetermined level is of the order of one quantisation step of a quantiser of the DAC.

24. A multi-bit delta-sigma DAC according to claim 13 wherein the selector comprises a digital encoder.

* * * * *

UNITED STATES PATENT AND TRADEMARK OFFICE
CERTIFICATE OF CORRECTION

PATENT NO. : 8,537,042 B2  
APPLICATION NO. : 13/359741  
DATED : September 17, 2013  
INVENTOR(S) : Zare-Hoseini et al.

Page 1 of 1

It is certified that error appears in the above-identified patent and that said Letters Patent is hereby corrected as shown below:

In the Specification

In Column 3, Line 23, delete "ADC" and insert -- ADC. --, therefor.

In Column 4, Line 17, delete "DAC" and insert -- DAC. --, therefor.

In Column 6, Line 23, delete "DAC 26" and insert -- DAC 16 --, therefor.

In Column 6, Lines 53-54, delete "DAC 26" and insert -- DAC 16 --, therefor.

Signed and Sealed this  
Fifth Day of November, 2013

Teresa Stanek Rea  
*Deputy Director of the United States Patent and Trademark Office*